United States Patent
Siahpolo et al.

(10) Patent No.: US 6,975,519 B2
(45) Date of Patent: Dec. 13, 2005

(54) INSERTION AND EXTRACTION MECHANISM FOR CIRCUIT BOARDS

(75) Inventors: Hassan Siahpolo, Campbell, CA (US); Michael E. Close, Fremont, CA (US)

(73) Assignee: Sun Microsystems, Inc., Santa Clara, CA (US)

(*) Notice: Subject to any disclaimer, the term of this patent is extended or adjusted under 35 U.S.C. 154(b) by 195 days.

(21) Appl. No.: 10/417,634

(22) Filed: Apr. 17, 2003

(65) Prior Publication Data

US 2004/0209502 A1    Oct. 21, 2004

(51) Int. Cl.[7] .............................................. H05K 7/12
(52) U.S. Cl. ...................... 361/798; 361/754; 361/756; 361/741; 361/802
(58) Field of Search ................................ 361/726, 732, 361/747, 754, 759, 801, 756, 798, 741, 740, 361/802; 74/469; 254/120; 312/215, 216, 312/222; 70/85

(56) References Cited

U.S. PATENT DOCUMENTS

| | | |
|---|---|---|
| 4,421,372 A | 12/1983 | Golden |
| 4,597,173 A | 7/1986 | Chino et al. |
| 5,003,431 A | 3/1991 | Imsdahl |
| 5,506,758 A | 4/1996 | Cromwell |
| 5,691,859 A * | 11/1997 | Ulrich et al. .................. 360/92 |
| 5,980,281 A | 11/1999 | Neal et al. |
| 6,056,567 A | 5/2000 | Schell |
| 6,252,514 B1 * | 6/2001 | Nolan et al. ............. 340/686.4 |
| 6,373,713 B1 | 4/2002 | Jensen et al. |

* cited by examiner

Primary Examiner—Kamand Cuneo
Assistant Examiner—Dameon E. Levi
(74) Attorney, Agent, or Firm—Meyertons Hood Kivlin Kowert & Goetzel, P.C.; B. Noël Kivlin; Chris D. Thompson

(57) ABSTRACT

A mechanism for insertion of a circuit board into a rack assembly and extraction of a circuit board from the rack assembly. The mechanism may include a pair of levers coupled to a circuit board assembly. First and second members may be coupled to each of the levers. The first member may be positionable to engage an engaging formation on a rack for insertion of the circuit board into the rack assembly. The second member may be positionable to engage the engaging formation for extraction of the circuit board from the rack assembly.

42 Claims, 15 Drawing Sheets

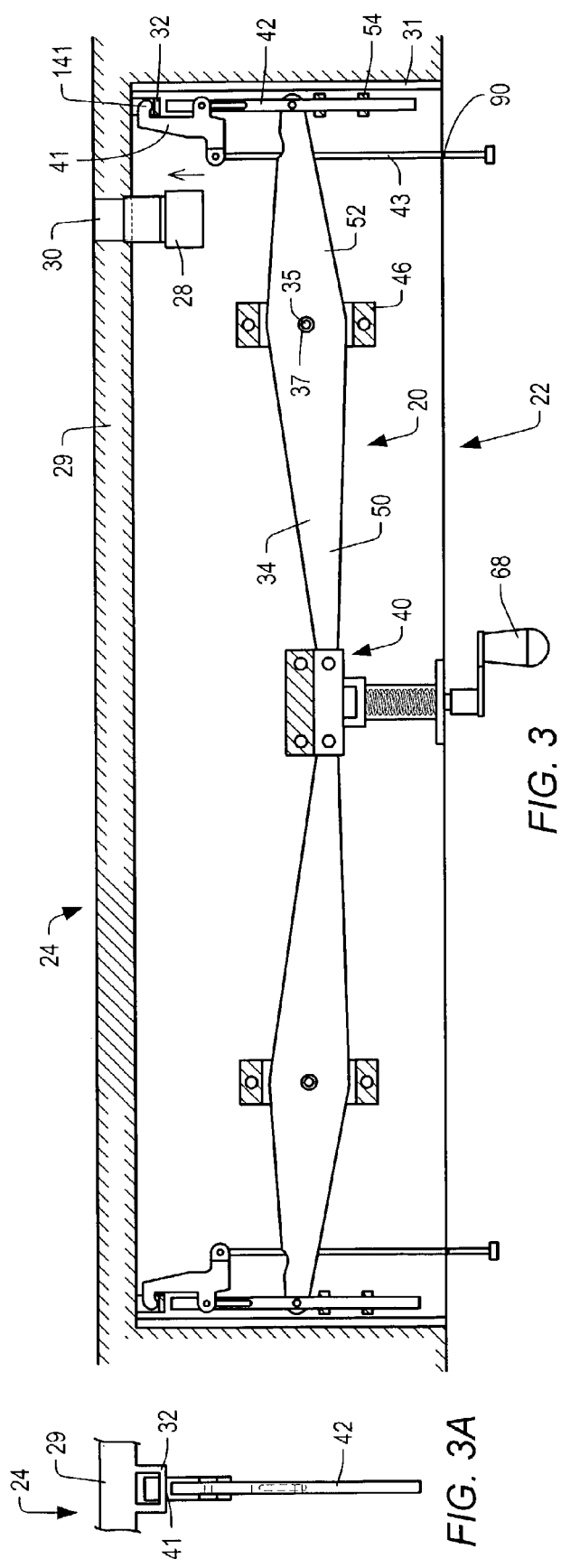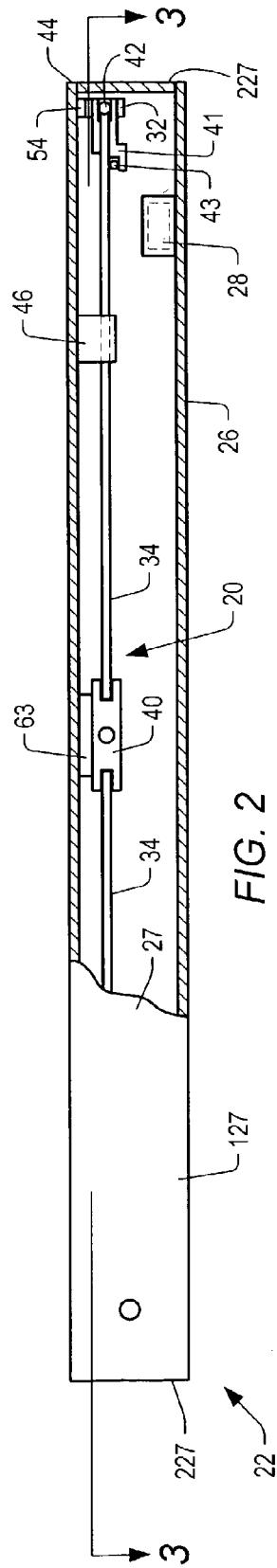

US 6,975,519 B2

INSERTION AND EXTRACTION MECHANISM FOR CIRCUIT BOARDS

BACKGROUND OF THE INVENTION

1. Field of the Invention

The present invention relates generally to mechanisms for inserting and extracting circuit boards from system rack assemblies. More particularly, this invention relates to an improved mechanism for inserting and extracting circuit boards in applications where large insertion forces may be required.

2. Description of the Relevant Art

Electronic systems such as computers are typically constructed in a modular fashion from circuit boards, each circuit board generally performing a specific function. Each circuit board requires multiple electrical connections which are generally provided by two part multi-contact electrical connectors which include a board part of the connector attached to the circuit board and a second part attached to a rack, system chassis assembly, or another circuit board (e.g., backplane circuit board), which acts as a socket for receiving the board part of the connector. As used herein, "circuit board" generally means any assembly or structure that contains electrical components (including, but not limited to, semiconductor devices, resistors, capacitors, relays, switches, and connectors) or electrical connections for an electrical system. "Circuit board" includes, but is not limited to, a fibreglass printed circuit board. As used herein, "rack" or "rack assembly" generally means any assembly or structure adapted to receive a circuit board, including, but not limited to, a rack, system chassis assembly, or backplane circuit board. Successful mating of the connector parts is required in order to provide reliable electrical connection between the first and the second parts of the connectors.

A number of mechanisms are known for inserting a circuit board into a rack assembly or extracting a circuit board from a rack assembly. Such mechanisms may comprise a lever arm pivotally coupled to the circuit board and arranged to engage a projection formed on the rack. Guide formations may be provided on the rack to receive the circuit board and to guide the circuit board into a load position in which the board and rack parts of the electrical connector engage. The lever arm may be arranged on the circuit board so that when the lever arm is in a raised position, the connector and socket are disengaged, whereas when the lever arm is lowered by application of force, the circuit board is provided with a biasing force that serves to move the circuit board in a direction guided by the guiding formations towards the socket, thereby mating the first and second parts of the electrical connector.

For circuit boards with connectors having a relatively large number of pins, large insertion forces may be required to engage the connectors. For example, a large board may contain twenty or more multi-contact connectors that contain several thousand individual contacts in the aggregate. Each contact requires the application of an insertion force to seat the contact. Thus, the total insertion force required to seat a large board may be 500 pounds or more. Moreover, individual contacts are easily damaged if the mating connector parts are not properly aligned when they come into contact with each other. This problem is especially acute where large forces are required to mate the connectors.

Circuit boards may encounter a variety of external loads. Some loads relate to environmental conditions while in service, such as shock or vibration. Other loads are encountered during assembly, such as those applied during installation or removal of components on the circuit board or other elements in the rack assembly. In either case, the loads may cause separation of or damage to individual contacts, resulting in reduced reliability of the system. Special purpose hardware, such as screws, bolts, or clamps, may be used to contain the circuit board in view of such loads. However, the use of such hardware increases the complexity and cost of the system.

Accordingly, there is a need for an improved mechanism for inserting and extracting a circuit board that enables application of a large insertion force and facilitates successful mating of connector parts without damage to the contacts. There is further a need for an improved mechanism for maintaining a circuit board in place when the circuit board encounters external loads.

SUMMARY OF THE INVENTION

In an embodiment, a mechanism for insertion and extraction of a circuit board may be included in a circuit board assembly. The mechanism may include a pair of levers coupled to the circuit board assembly. The levers may be coupled to each other at central arms of the levers. The mechanism may be adapted to apply forces to insert or extract the circuit board assembly.

In an embodiment, first and second members may be coupled to the each of the levers. The first members may be positionable to engage engaging formations on a rack assembly for insertion of the circuit board into the rack assembly. The second members may be positionable to engage engaging formations for extraction of the circuit board from the rack assembly.

In an embodiment, the second members may be pivotally coupled to side arms of the levers. The first members may be pivotally and slidably coupled to the second members. The first members may be retractable by pivoting and sliding the first members along slots in the second members such that the first members are withdrawn from the engaging formations. In one embodiment, first members of a mechanism may be in the form of latch paws, and the second members may be in the form of shafts.

In an embodiment, a third member may be operable by a user to control the position of a first member. The third member may be pivotally coupled to the first member and slidably coupled to the circuit board. An indicator may be included on the third member to indicate when a board connector part and a rack connector part are coupled or not coupled.

In an embodiment, first and second members may be coupled to a pair of levers to engage engaging formations on opposing sides of a rack assembly. The mechanism may be adapted so that the levers can be synchronously operated to apply a plurality of forces at different locations of the circuit board (e.g., left and right sides). Synchronous operation of the levers may inhibit skewing of a circuit board assembly during insertion or extraction of the circuit board assembly.

In an embodiment, second members may be adapted to act as stops against engaging formations to inhibit motion of a circuit board assembly toward a rack assembly when the circuit board assembly is initially positioned for installation. The stops may inhibit connector sockets in a board connector part from contacting pins of a rack connector part until the mechanism is operated to insert the circuit board assembly. The stop feature may reduce the risk of damage to the pins during installation.

In an embodiment, an actuator may be provided for operation of one or more levers. The actuator may include any of various mechanisms known to those skilled in the art to impart or control motion, such as an acme screw drive mechanism, ball screw drive mechanism, or linear motor. The actuator may be manually operated or powered.

In an embodiment, a circuit board assembly may include a multiplicity of multi-contact connectors, e.g., 20 or more. A mechanism may be adapted to apply an insertion force of at least about 500 pounds and an extraction force of at least about 500 pounds. A mechanism may be adapted so that a user can apply the insertion or extraction forces using only one hand.

In embodiment, the levers of the mechanism may be substantially inhibited from moving when the circuit card is installed (such as by friction between a lead screw and drive nut in an actuator). Engagement of first members with engaging formations may keep a circuit board assembly from backing out of a rack assembly during further assembly or use of the system.

In an embodiment, a mechanism for inserting and removing a circuit card may include only a single lever. In another embodiment, a mechanism may include a plurality of levers that are each moved independently. In still another embodiment, an actuator may be coupled directly to first and second members adapted to engage engaging formations on a rack assembly, without a lever between the actuator and the first and second members.

In an embodiment, some elements of a circuit board assembly may combine to form an apparatus comprising a Faraday cage. A mechanism for inserting and extracting the circuit board assembly may be substantially disposed within the Faraday cage. The Faraday cage may at least partially shield electrical components mounted on the circuit board from electromagnetic noise.

BRIEF DESCRIPTION OF THE DRAWINGS

Other objects and advantages of the invention will become apparent upon reading the following detailed description and upon reference to the accompanying drawings in which:

FIG. 2 shows a front view of circuit board assembly including a mechanism for insertion and extraction of the circuit board.

FIG. 3 shows a sectional top view of the circuit board assembly of FIG. 2.

FIG. 3A shows a cut away side view a mechanism and an engaging formation.

Figure 1:
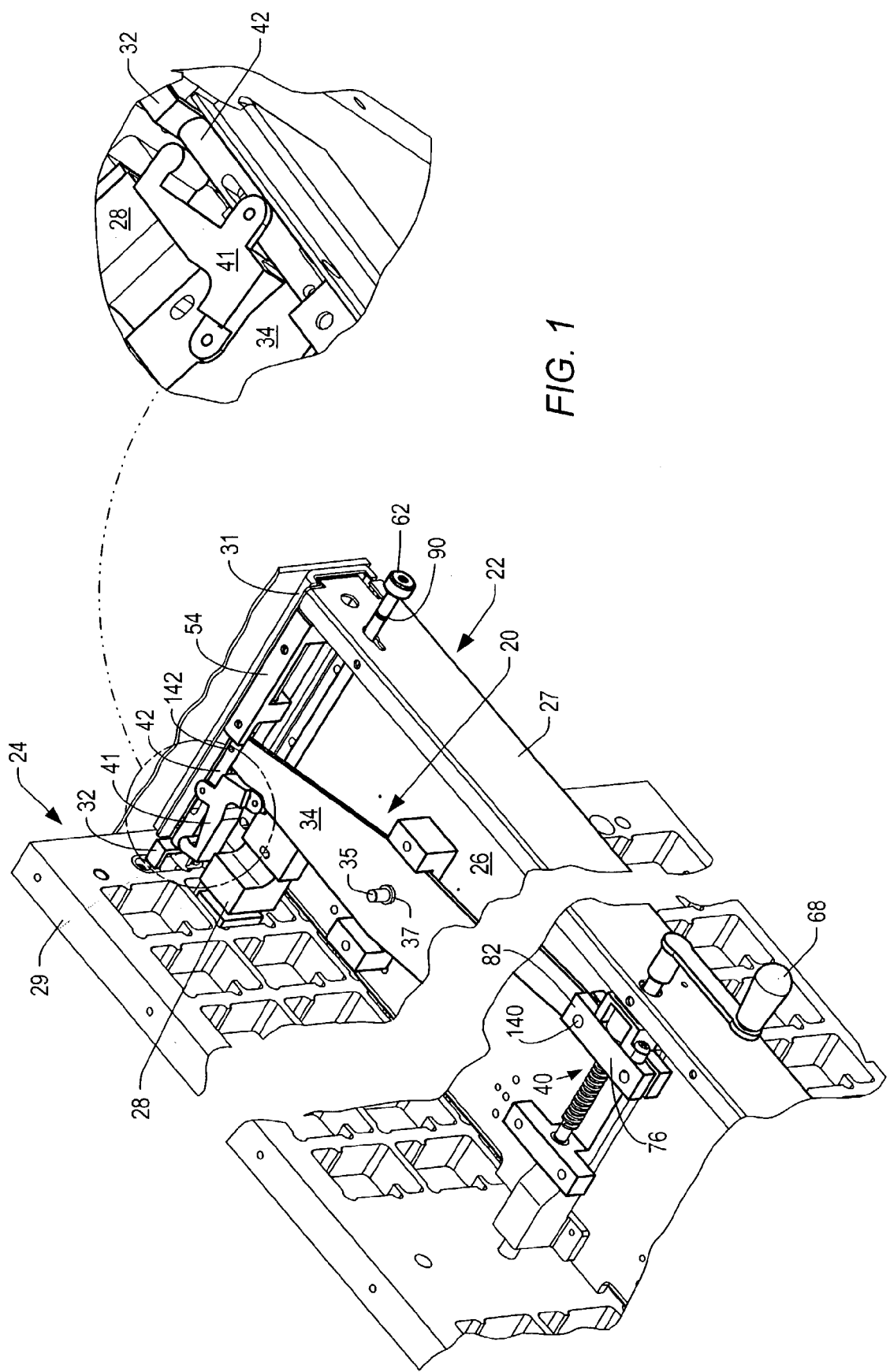
FIG. 1 shows a circuit board assembly including a mechanism for insertion and extraction of the circuit board.

While the invention is susceptible to various modifications and alternative forms, specific embodiments thereof are shown by way of example in the drawing and will herein be described in detail. It should be understood, however, that the drawings and detailed description thereto are not intended to limit the invention to the particular form disclosed, but on the contrary, the intention is to cover all modifications, equivalents, and alternatives falling within the spirit and scope of the present invention as defined by the appended claims.

DETAILED DESCRIPTION OF THE INVENTION

A mechanism for insertion and extraction of a circuit board is depicted in FIGS. 1–3. As shown in FIG. 1, mechanism 20 may be included in circuit board assembly 22. Circuit board assembly 22 may further include circuit board 26, chassis 27, and a top plate (not shown in FIG. 1 for clarity). Circuit board 26 may include board connector part 28 of one or more connectors.

As shown in FIG. 2, circuit board 26 may be positioned horizontally at the bottom of circuit board assembly 22. Chassis 27 may be coupled to circuit board 26 near the edges of circuit board 26. Chassis 27 may include a front panel 127 and side panels 227. Top plate 44 may be installed onto chassis 27. Chassis 27 and top plate 44 may combine to form a housing. Mechanism 20 may be mounted on the underside of top plate 44.

Referring to FIG. 3, rack assembly 24 may be configured to receive circuit board assembly 22. Rack assembly 24 may include a rack connector part 30 corresponding to each board connector part 28. Rack connector part 30 may be located in bulkhead 29. Rack assembly 24 may include guide rails 31 to facilitate insertion and extraction of circuit board assembly 22. Rack assembly 24 may further include engaging formations 32. Engaging formations 32 may be in the form of a rectangular loop, as shown in FIG. 3A. Rack connector part 30 may be mounted to a back plane circuit board, bulkhead structure, or any other structure that accommodates connectors as are known to those skilled in the art.

Mechanism 20 may include a pair of levers 34 coupled to circuit board assembly 22 at mid pivot points 35. Levers 34 may be pivotally mounted to top plate 44 by a pair of pivot blocks 46. Each of the levers 34 may include center arm 50 and side arm 52. Actuator 40 may be mounted to circuit board assembly 22. Levers 34 may be coupled to actuator 40 near the ends of center arms 50. Pivot bearings 37 may be included at mid pivot points 35 to reduce friction in mechanism 20. Crank handle 68 may be coupled to actuator 40.

First members 41 and second members 42 may be coupled to each of side arms 52. First members 41 and second members 42 may be adapted to cooperatively engage surfaces of engaging formation 32. Mechanism 20 may include guides 54 for second member 42.

As used herein, "engage" or "engaged" includes, but is not limited to, any condition in which one element contacts another during operation or use of the mechanism. For example, second member 42 may engage a front surface 232 by contact between front surface 232 and the forward end of second member 42.

Pivot blocks 46, actuator 40, and guides 54 may be mounted to circuit board assembly 22 at top plate 44. Mounting may be accomplished by various methods, including, but not limited to, screws, bolts, rivets, or welding.

Figure 4:
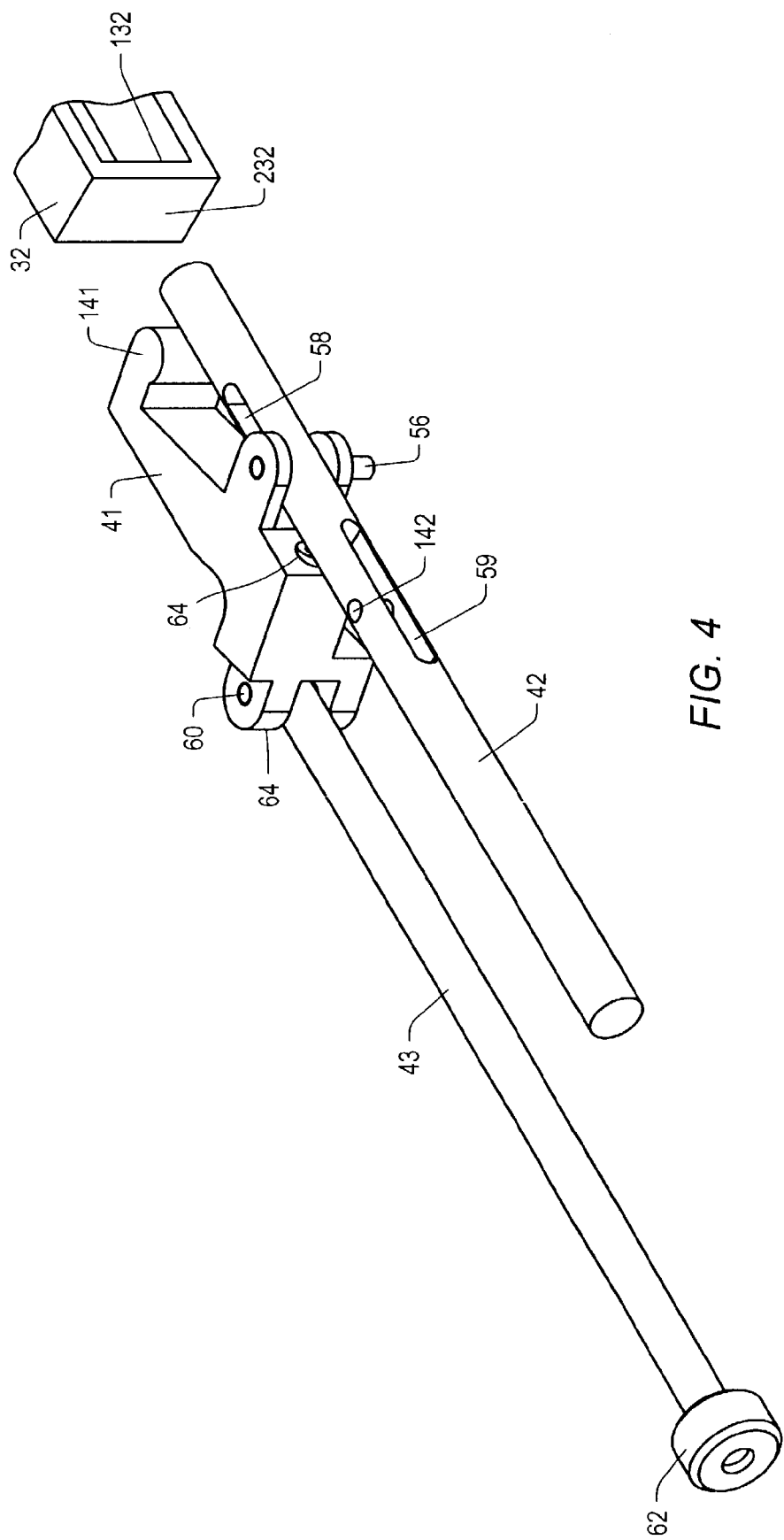
FIG. 4 shows a detail view of first, second and third members of a mechanism.

A detail view of first and second members 41, 42 is depicted in FIG. 4. In an embodiment, first member 41 may be positionable to engage a rear surface 132 of an engaging formation 32 on rack assembly 24 during use. Second member 42 may be positionable to engage a front surface 232 of an engaging formation 32 during use.

First member 41 may be pivotally and slidably coupled to second member 42 along slot 58. First member 41 may include projection 141 for engaging rear surface 132. First member 41 may be retractable such that it is inhibited from engaging the engaging formation 32. When first member 41 is in the retracted position, the tip of projection 141 may rest against second member 42. In an embodiment, first member 41 may be in the form of a latch paw, as shown in FIG. 4. However, it will be understood that first member 41 may be of various other forms, including, but not limited to, a hook, a bar, or a pin.

Second member 42 may contain slot 59 for accommodating lever 34 (not shown). Coupling of second member 42 to lever 34 may be by means of a dowel pin (not shown) at pivot point 142. Second member 42 may be made of a high-strength material, such as stainless steel. In an embodiment, second member 42 may be in the form of a shaft, as shown in FIG. 4. However, it will be understood that second member 42 may be of various other forms, including, but not limited to, a plate, a bar, or a block.

Third member 43 may be pivotally coupled to first member 41 at pivot point 60. Third member 43 may be operable by a user to control the position of first member 41. Third member 43 may be a rod coupled to knob 62.

In an embodiment, a resiliently deformable member may be coupled to first member 41 and adapted to exert a force against second member 42. The resiliently deformable member may be spring plunger assembly 64. When first member 41 is positioned such that projection 141 is past engaging formation 32, spring plunger assembly 64 may bias projection 141 into engagement with rear surface 132.

In some embodiments, lever 34 (not shown in FIG. 4), first member 41, and second member 42 may be produced as separate elements. In other embodiments, two or more of first member 41, second member 42, and lever 34 may be produced as a single element.

Figure 5:
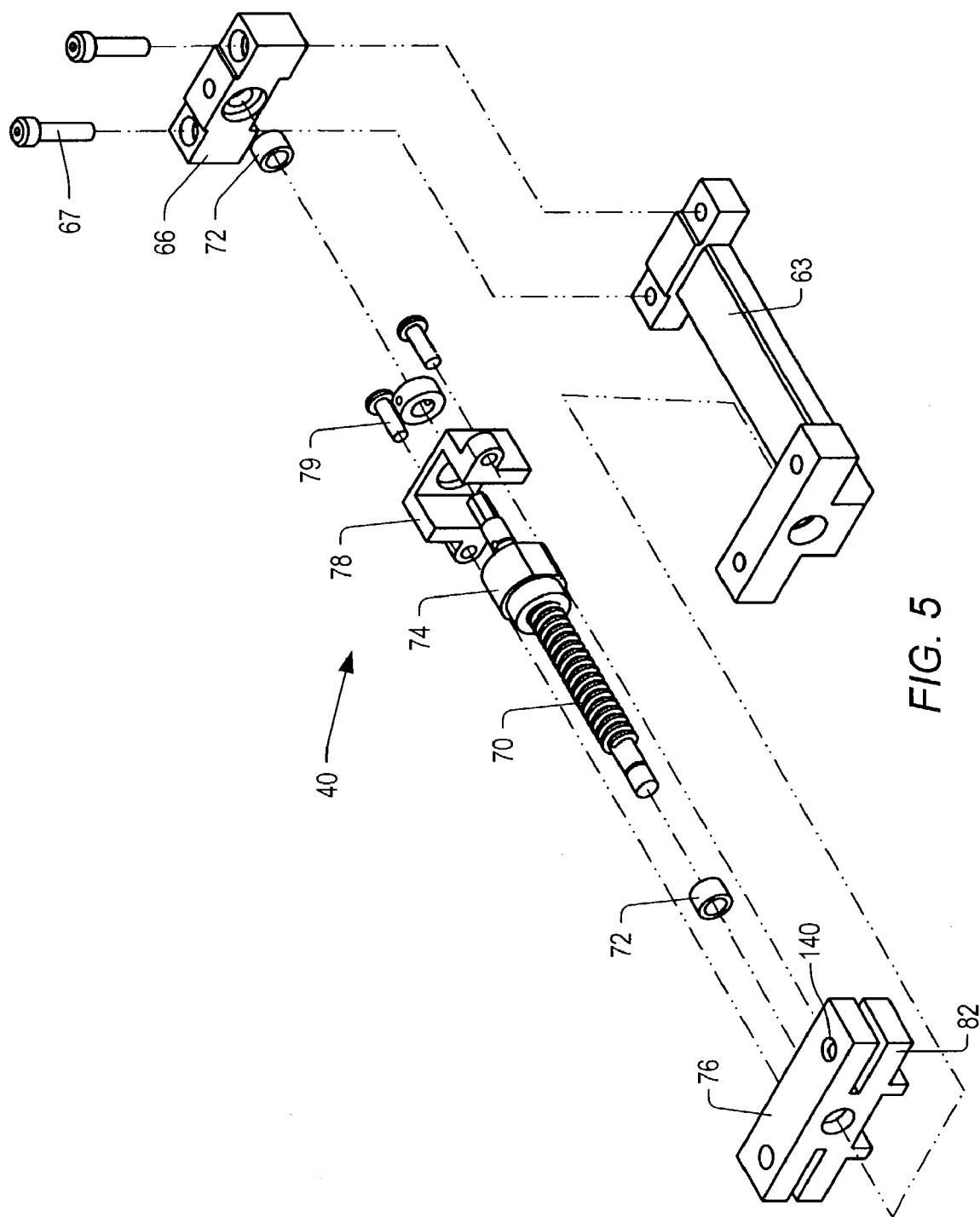
FIG. 5 shows an exploded view of an actuator for a mechanism, including a lead screw and a drive nut.

Referring to FIG. 5, actuator 40 may include any of various mechanisms known to those skilled in the art to impart or control motion, including, but not limited to, an acme screw drive mechanism, ball screw drive mechanism, or linear motor. Actuator 40 may be manually operated or powered. For example, actuator 40 may be operated using a crank handle.

In an embodiment, actuator 40 may include lead screw 70 rotatably mounted to center mount 63 and shaft support 66. Shaft support 66 may be coupled to center mount 63 using screws 67. Shaft bearings 72 may be disposed in center mount 63 and shaft support 66. Lead screw 70 may engage drive nut 74. Drive nut 74 may be coupled to slide block 76 with bracket 78 using screws 79. Slide block 76 may include a pair of lateral devises 82. As shown in FIG. 1, slide block 76 may be pivotally coupled to levers 34 at lateral devises 82 using pins (not shown) at center pivot points 140. In use, slide block 76 may travel along with drive nut 74 along the length of lead screw 70, moving levers 34.

Figure 6:
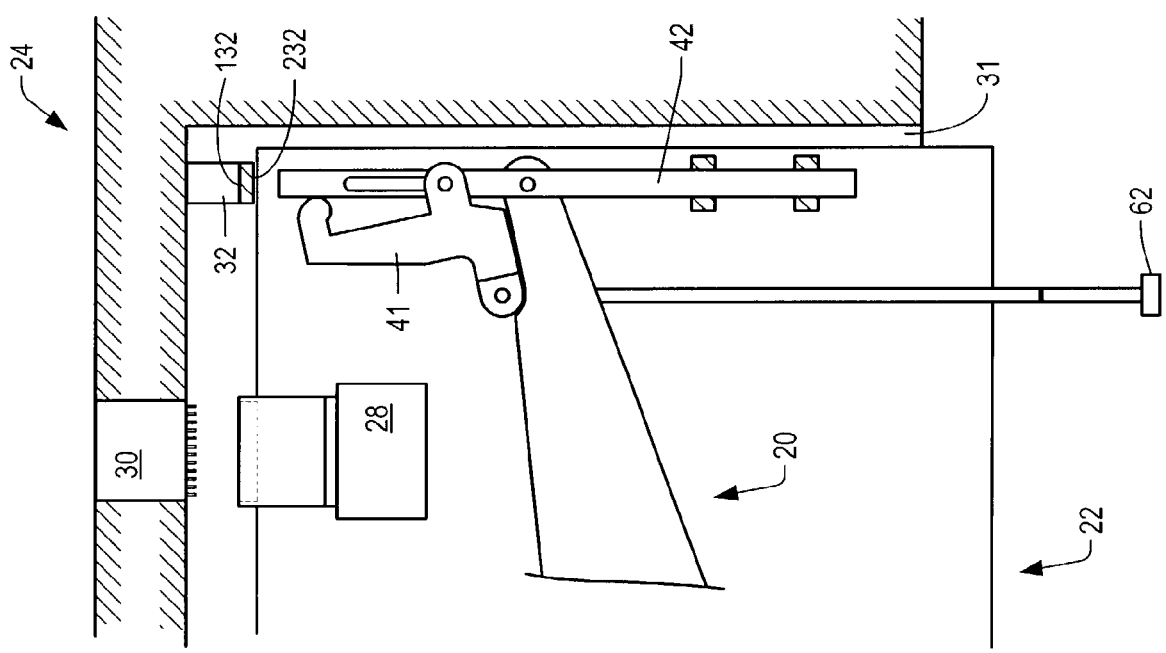
FIG. 6 shows a cut away top view of a mechanism including a first member in a retracted position.
Figure 7:
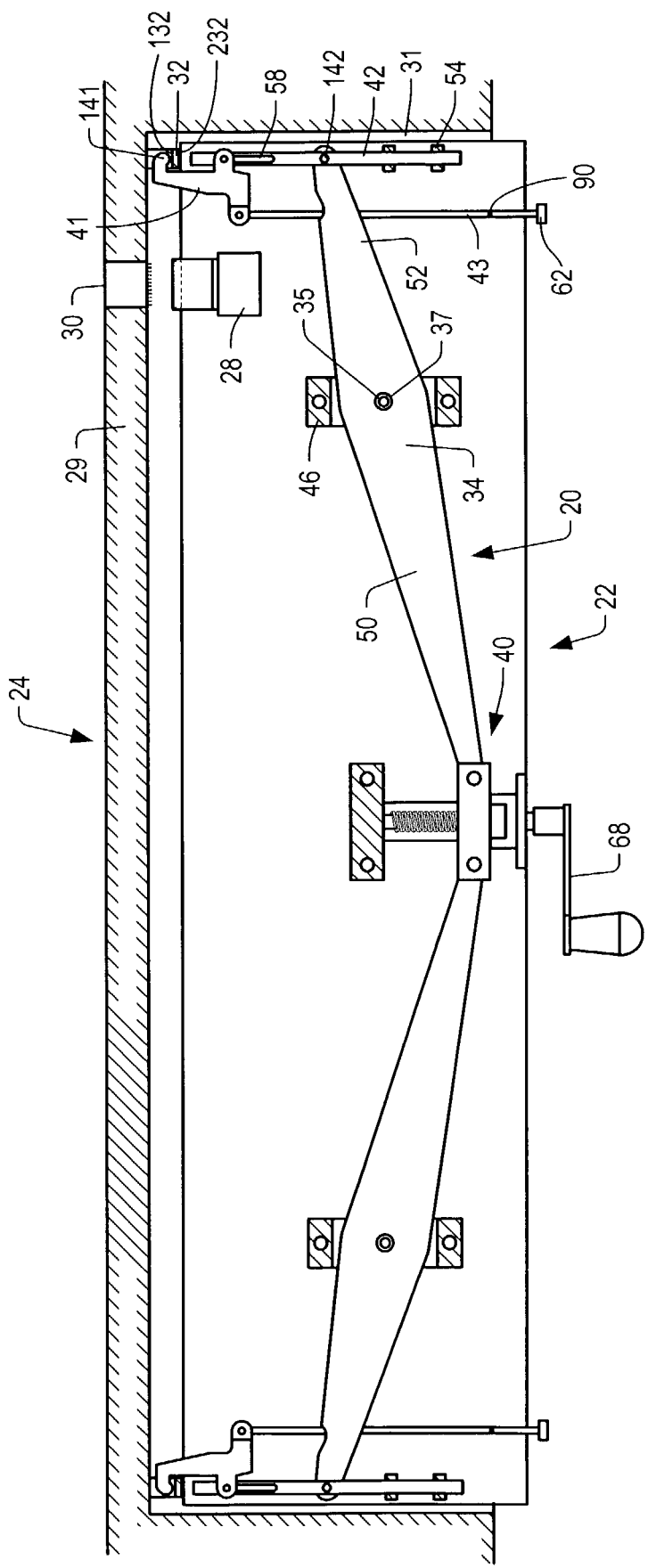
FIG. 7 shows a top view of a circuit card assembly before insertion into a rack assembly.
Figure 8:
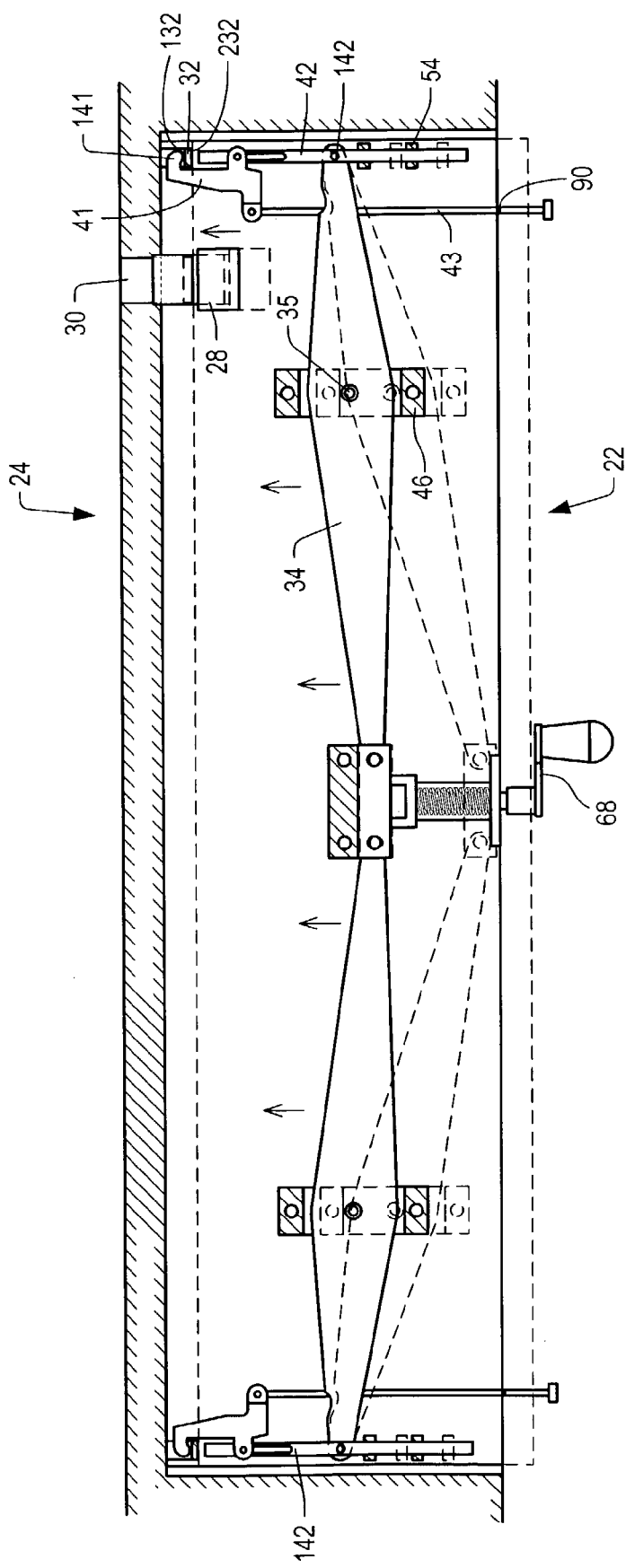
FIG. 8 shows a top view of a circuit card assembly after insertion into a rack assembly.

FIGS. 6–8 depict insertion of circuit board assembly 22 into rack assembly 24. Prior to using mechanism 20, circuit board assembly 22 may be initially positioned in rack assembly 24. As shown in FIG. 6, knobs 62 may be pulled out so that first members 41 are retracted from engaging formations 32 when the circuit board assembly is initially positioned. Circuit board assembly 22 may be placed onto guide rails 31 and pushed forward toward rack assembly 24 until second members 42 contact front surfaces 232. Contact between second members 42 and front surfaces 232 may inhibit further forward movement of the circuit board assembly 22 until mechanism 20 is operated to insert the circuit board assembly. As initially installed, a gap may exist between sockets of connector part 28 and pins of connector part 30, as shown in FIG. 6. Thus, the sockets, and pins may not come into contact until mechanism 20 is operated.

Figure 9:
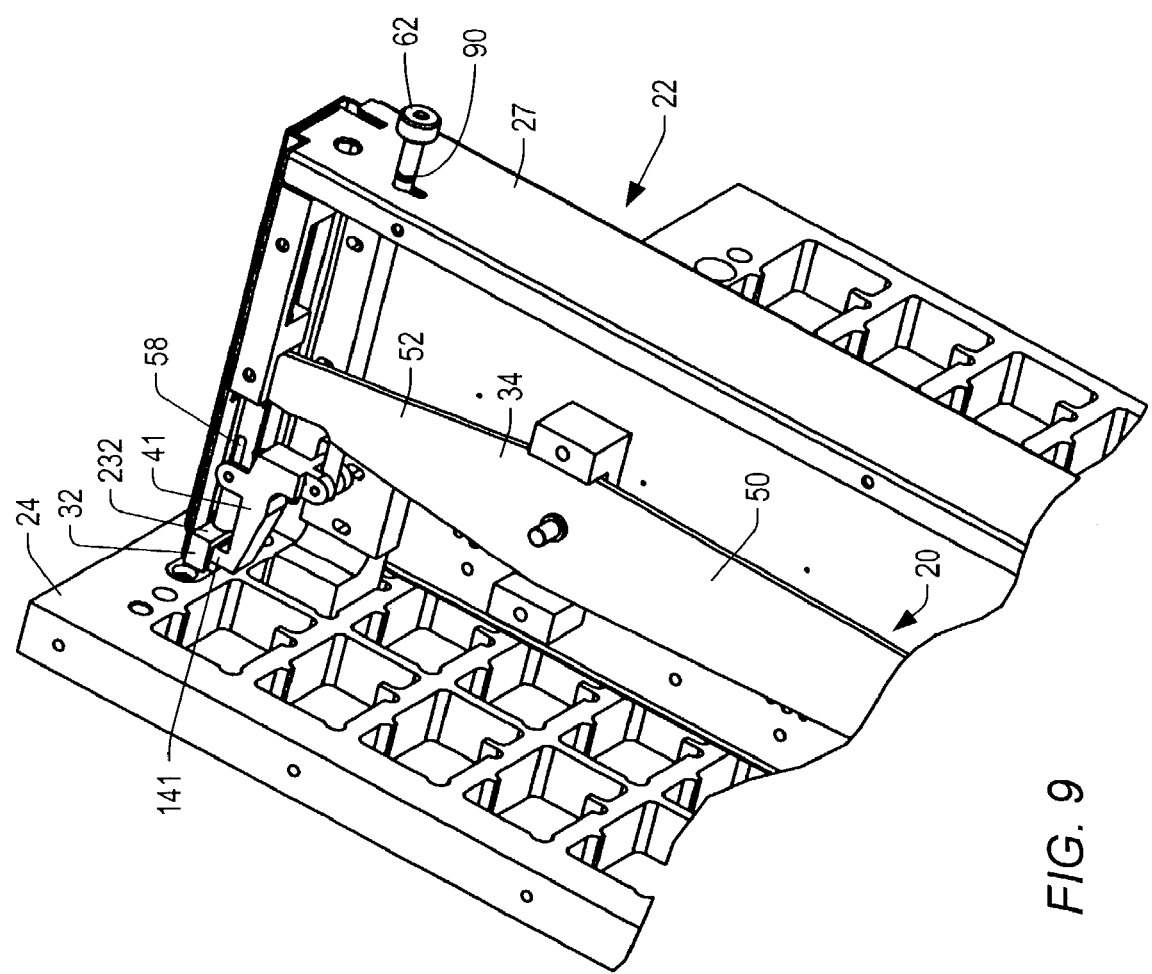
FIG. 9 shows a cut away view of a mechanism when a circuit board in an installed position.
Figure 10:
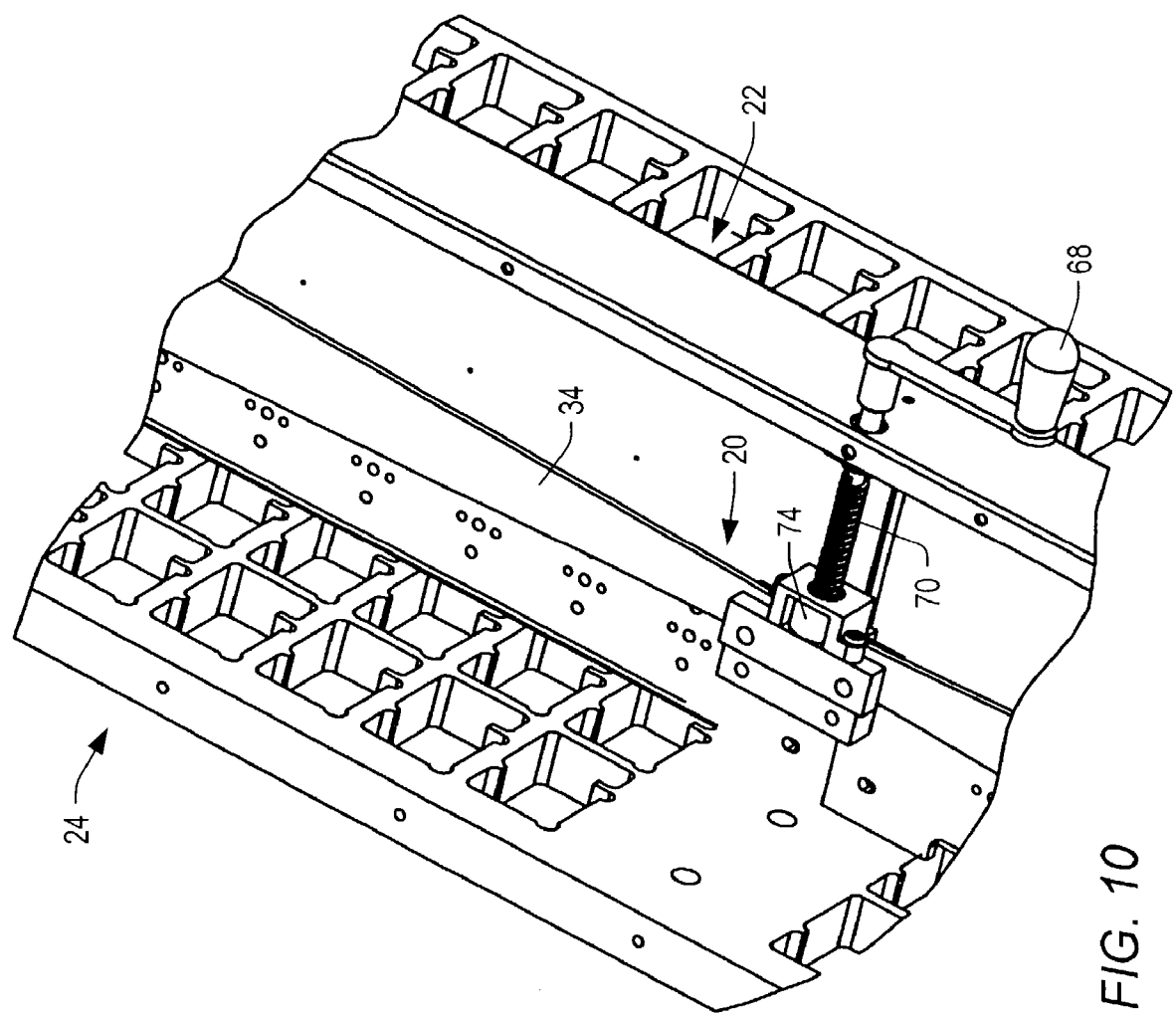
FIG. 10 shows a center cut away view of a mechanism when a circuit board in an installed position.

Referring to FIG. 7, to use mechanism 20 to insert circuit board assembly 22, knobs 62 may be pushed forward to position first members 41 so that projections 141 can engage rear surfaces 132 of engaging formations 32. Crank handle 68 may be operated to move center arms 50 of levers 34 forward relative to mid pivot points 35. Simultaneously, side arms 52 of levers 34 will move back relative to mid pivot points 35. Once levers 34 have moved to where first members 41 have reached the forward ends of slots 58 and projections 141 have engaged rear surfaces 132 (as shown in FIG. 7), second member 42 may be inhibited from further travel away from rack assembly 24 by contact between projections 141 and engaging formations 32. Thus, side pivot points 142 may be substantially fixed relative to rack assembly 24. As shown in FIG. 8, further operation of crank handle 68 may cause levers 34 to pivot forward about side pivot points 142 in the direction indicated by the arrows in FIG. 8. Forward travel of levers 34 about side pivot points 142 may cause forces to be applied on circuit card assembly 22 at mid pivot points 35 via top plate 44 and/or pivot blocks 46, urging circuit card assembly 22 forward into rack assembly 24. When the forces applied at board connector part 28 exceed the total insertion forces required to seat the pins of rack connector part 30 into the sockets of board connector part 28, the circuit card assembly may be inserted into rack assembly 24. The solid lines in FIG. 8 show the position of levers 34 and circuit board assembly 22 in the installed position. FIGS. 9 and 10 show circuit board assembly 22 in the installed position.

After the pins of rack connector part 30 are seated, first members 41 may remain in engagement with rear surfaces 132. When the circuit card assembly is installed, levers 34 may be substantially inhibited from moving, such as by friction between lead screw 70 and drive nut 74. Engagement of first members 41 with rear surfaces 132 may keep circuit board assembly 22 from backing out of rack assembly 24 during further assembly or use of the system. Such engagement may obviate a need for special fasteners to retain circuit board assembly 22.

Figure 11:
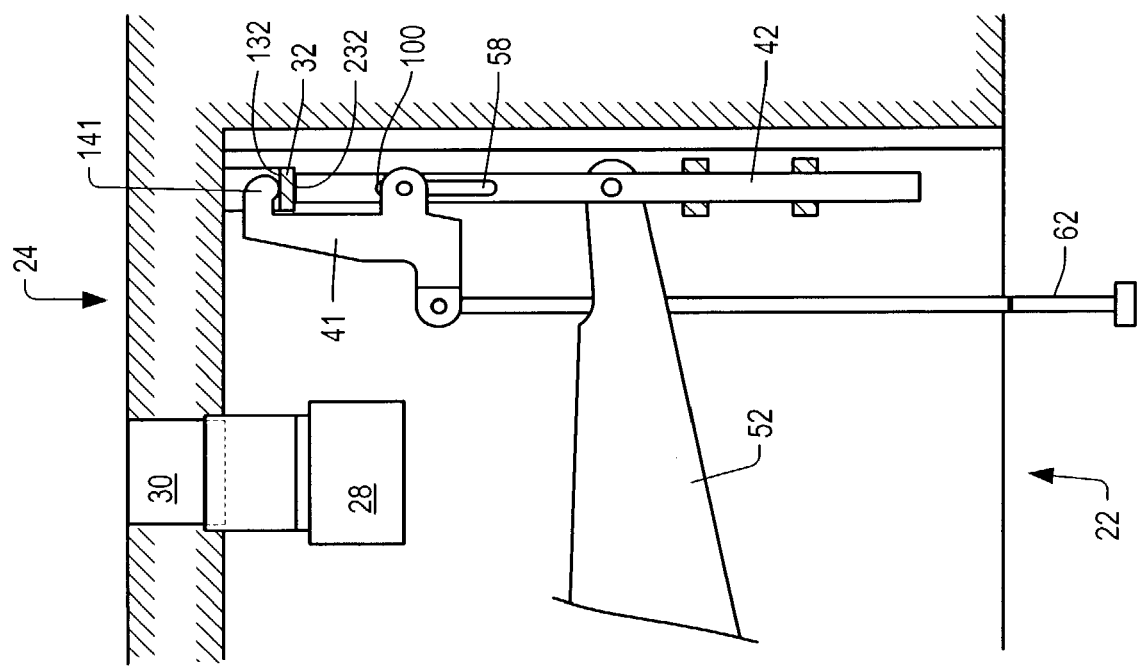
FIG. 11 shows a cut away top view of a mechanism configured for retraction of a first member.
Figure 12:
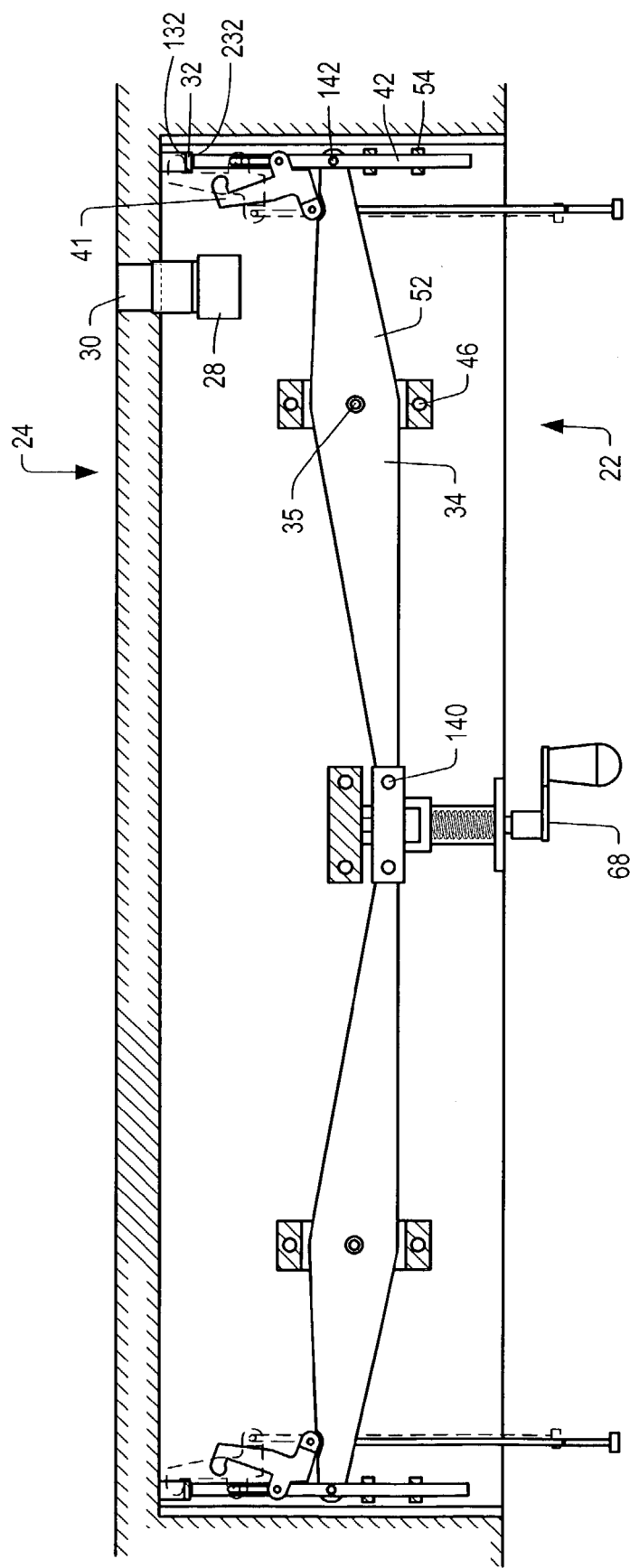
FIG. 12 shows a top view of a circuit card assembly before extraction from a rack assembly.
Figure 13:
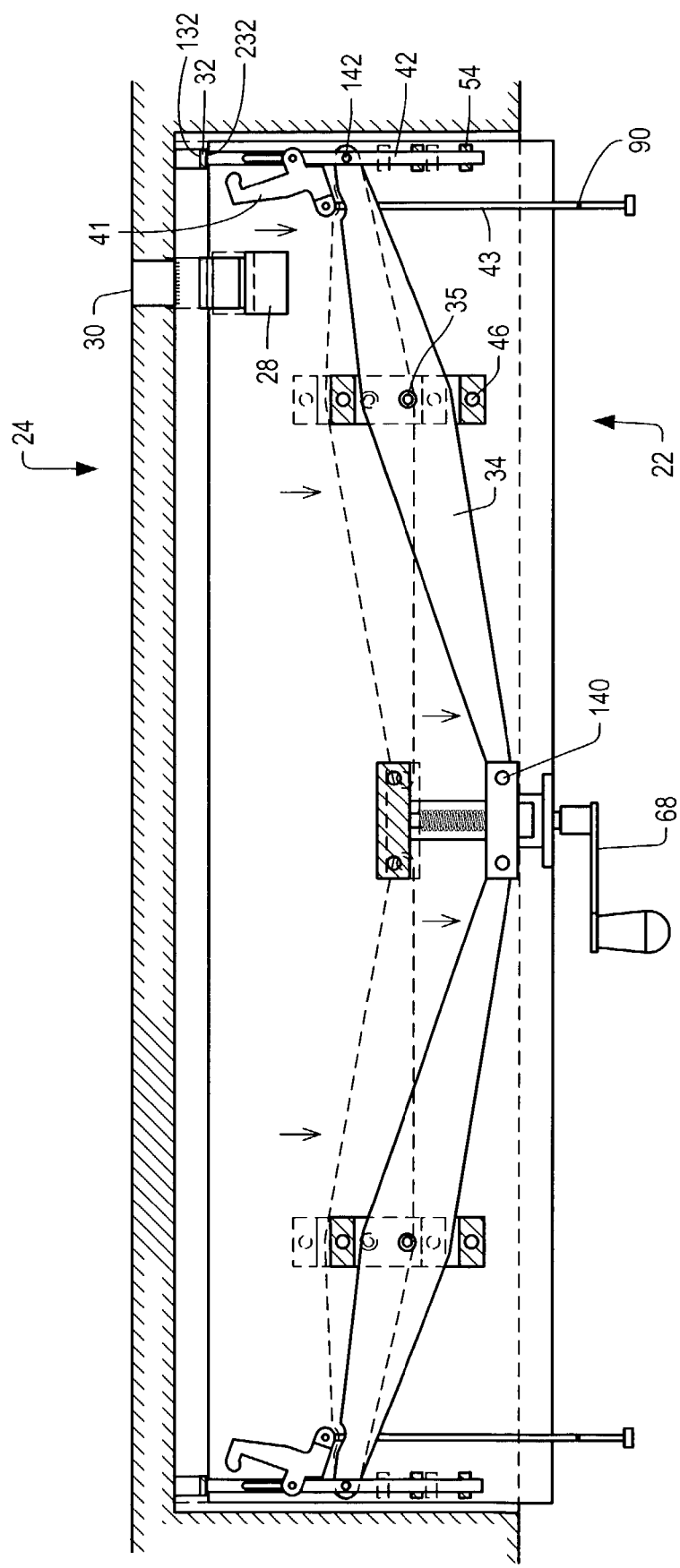
FIG. 13 shows a top view of a circuit card assembly after extraction from a rack assembly.

FIGS. 11–13 depict extraction of circuit board assembly 22 from rack assembly 24. Referring to FIG. 11, to prepare circuit board assembly 22 for extraction, crank handle 68 may be operated in the opposite direction as the crank handle was operated during insertion to move side arms 52 forward in an amount sufficient to relieve any significant forces applied by projections 141 on rear surfaces 132. In some cases, small gaps 100 may exist between first members 41 and the forward ends of slots 58 after this operation due to forward travel of second member 42 relative to first member 41, as shown in FIG. 11. Subsequently, first members 41 may be placed in a retracted position (e.g., where projections 141 are pivotally withdrawn and slid away from engaging formations 32) by pulling knobs 62 out. FIG. 12 shows first members 41 in a retracted position.

Figure 14:
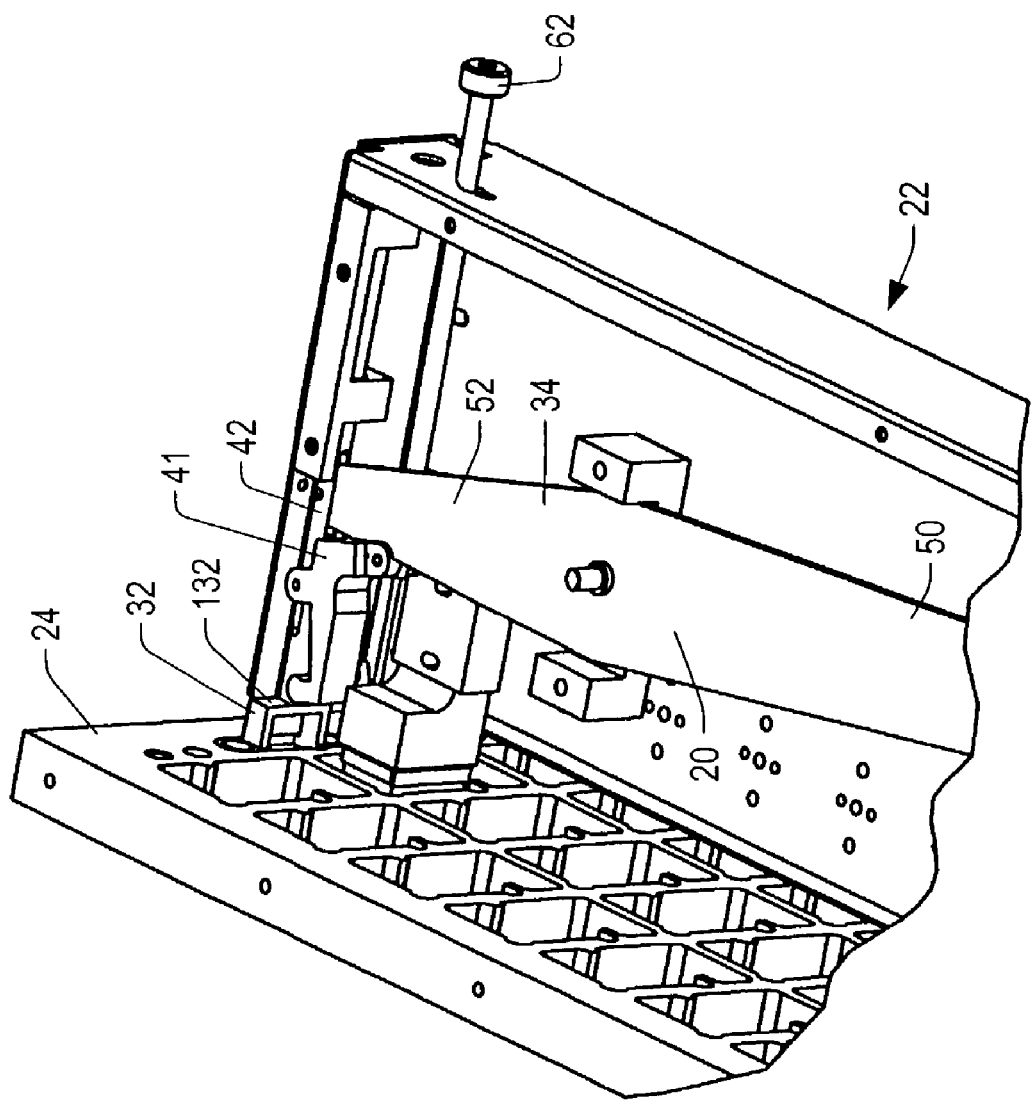
FIG. 14 shows a right side cut away view of a mechanism when a circuit board in an extracted position.
Figure 15:
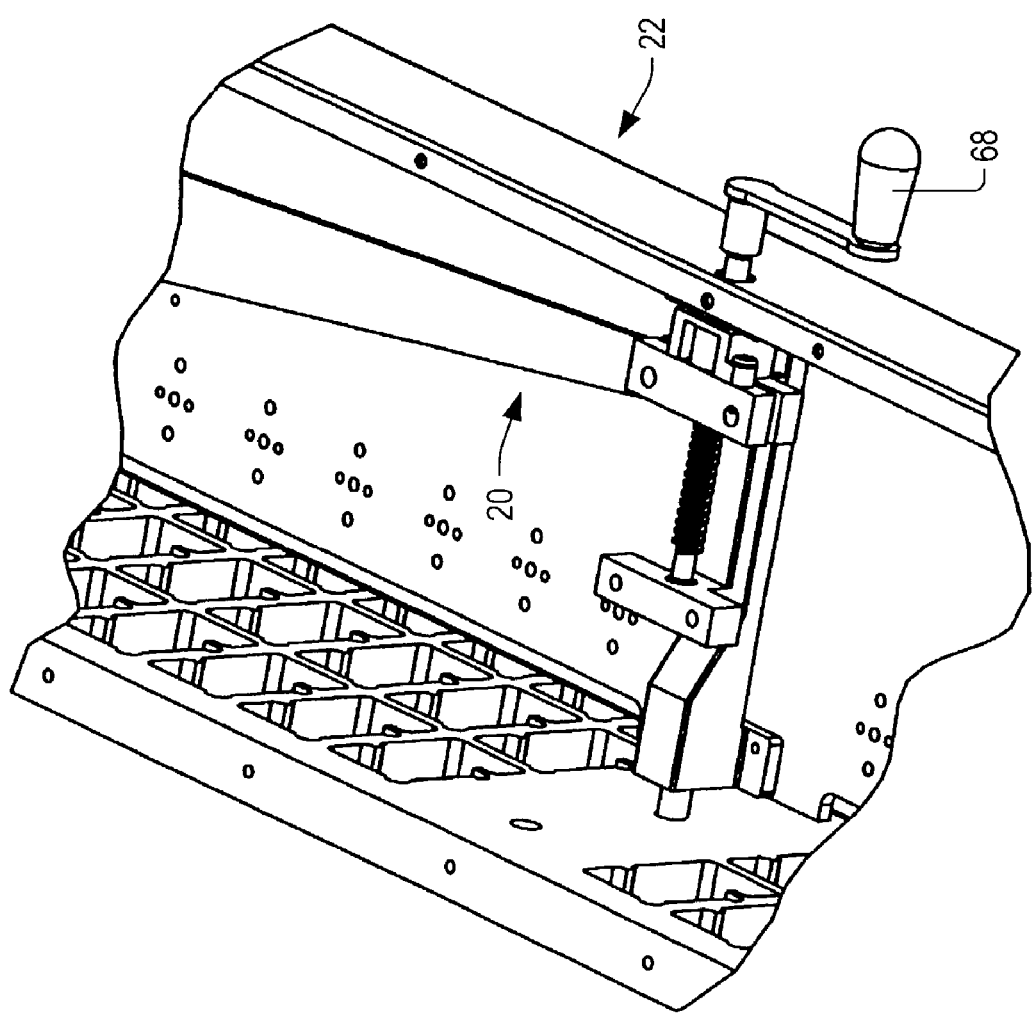
FIG. 15 shows a center cut away view of a mechanism when a circuit board in an extracted position.

To use mechanism 20 to extract circuit board assembly 22, crank handle 68 may be further operated in the opposite direction as the crank handle was operated during insertion. Side arms 52 may travel to where second members 42 engage front surfaces 232 of engaging formation 32, as shown in FIG. 12. Second members 42 may bear against front surfaces 232 such that further forward travel of second members 42 is inhibited. Thus, side pivot points 142 may be substantially fixed relative to rack assembly 24. As shown in FIG. 13, further operation of crank handle 68 may cause levers 34 to pivot back about side pivot points 142, in the direction indicated by the arrows. Backward travel of levers 34 about side pivot points 142 may cause forces to be applied on circuit card assembly 22 at mid pivot points 35 via top plate 44 and/or pivot blocks 46, urging circuit card assembly 22 away from rack assembly 24. When the forces applied at board connector part 28 exceed the total extraction forces required to unseat the pins of connector part 30 from the sockets of connector part 28, the circuit card assembly may be extracted from rack assembly 24. The solid lines in FIG. 13 show the position of levers 34 and circuit board assembly 22 in the extracted position. FIGS. 14 and 15 show circuit board assembly 22 in the extracted position.

It will be observed that as levers 34 are operated, the ends of center arms 50 and side arms 52 travel in an arc relative to mid pivot point 35. At the same time, the pins at mid pivot point 35, center pivot point 140, and side pivot point 142 may be constrained to move substantially in a straight line parallel to the side edges of circuit board assembly 22. Mechanism 20 may include features to accommodate relative lateral movement between the pins and the ends of levers 34. For example, slots may be provided at the ends of center arms 50 and side arms 52 for coupling with pins at center pivot points 140 and side pivot points 142, respectively.

Synchronous operation of a pair of levers may inhibit skewing of circuit board assembly 22 during insertion or extraction of the circuit board assembly. Inhibiting of skewing may reduce the risk of damage to the circuit board assembly. In some embodiments, left and right side elements may be substantially equal in length so that the mechanism is substantially symmetrical about a longitudinal axis of the circuit board, i.e., an axis parallel to circuit board 26 and perpendicular to bulkhead 29. A mechanism that is substantially symmetrical may facilitate application of equal loads at both engaging formations. However, even in embodiments where the levers are unequal in length, synchronous operation of the levers as described herein may inhibit damage of a circuit board assembly during insertion or extraction.

Referring once again to FIG. 6, second members 42 may be adapted to act as stops against front surfaces 232 to inhibit motion of circuit board assembly 22 toward rack assembly 24 when circuit board assembly 22 is initially positioned for installation. The stops may inhibit connector sockets in board connector part 28 from contacting pins in rack connector part 30 until mechanism 20 is operated to insert circuit board assembly 22. The stop feature may reduce the risk of damage to connector pins during installation.

Indicators may be included on at least one of third members 43 to indicate when a board connector part and a rack connector part are coupled or not coupled. For example, as shown in FIG. 8, indicator band 90 may be placed on third member 43. Indicator band 90 may match up to the front edge of chassis 27 when a board connector part and a rack connector part are coupled.

In some embodiments, circuit board assembly 22 may include a multiplicity of multi-contact connectors, e.g., 20 or more. Mechanism 20 may be adapted to apply an insertion force of at least about 500 pounds and an extraction force of at least about 500 pounds. Mechanism 20 may be adapted so that a user can apply the insertion or extraction forces using only one hand. For example, a user may apply insertion and extraction forces by turning crank handle 68.

In an embodiment, a mechanism for inserting and removing a circuit card may include only a single lever. In another embodiment, a mechanism may include a plurality of levers that are each moved independently. For example, a lever to engage an engaging formation on the left side of a rack assembly may be coupled to one actuator, while a lever to engage an engaging formation on the right side of a rack assembly may be coupled to another actuator. In still another embodiment, an actuator may be coupled directly to first and second members adapted to engage engaging formations on a rack assembly, without a lever between the actuator and the first and second members.

In an embodiment, some elements of a circuit card assembly may combine to form a Faraday cage. The Faraday cage may at least partially shield electrical components on circuit board 26 from electromagnetic noise. For example, top plate 44, chassis 27, bulkhead 29, and a copper layer within circuit board 26 may combine to form a Faraday cage. Mechanism 20 may be substantially contained within the Faraday cage. The Faraday cage may be substantially closed except for openings in chassis 27 for actuator 40 and third members 43, and for connector cutouts in bulkhead 29.

Figure 16:
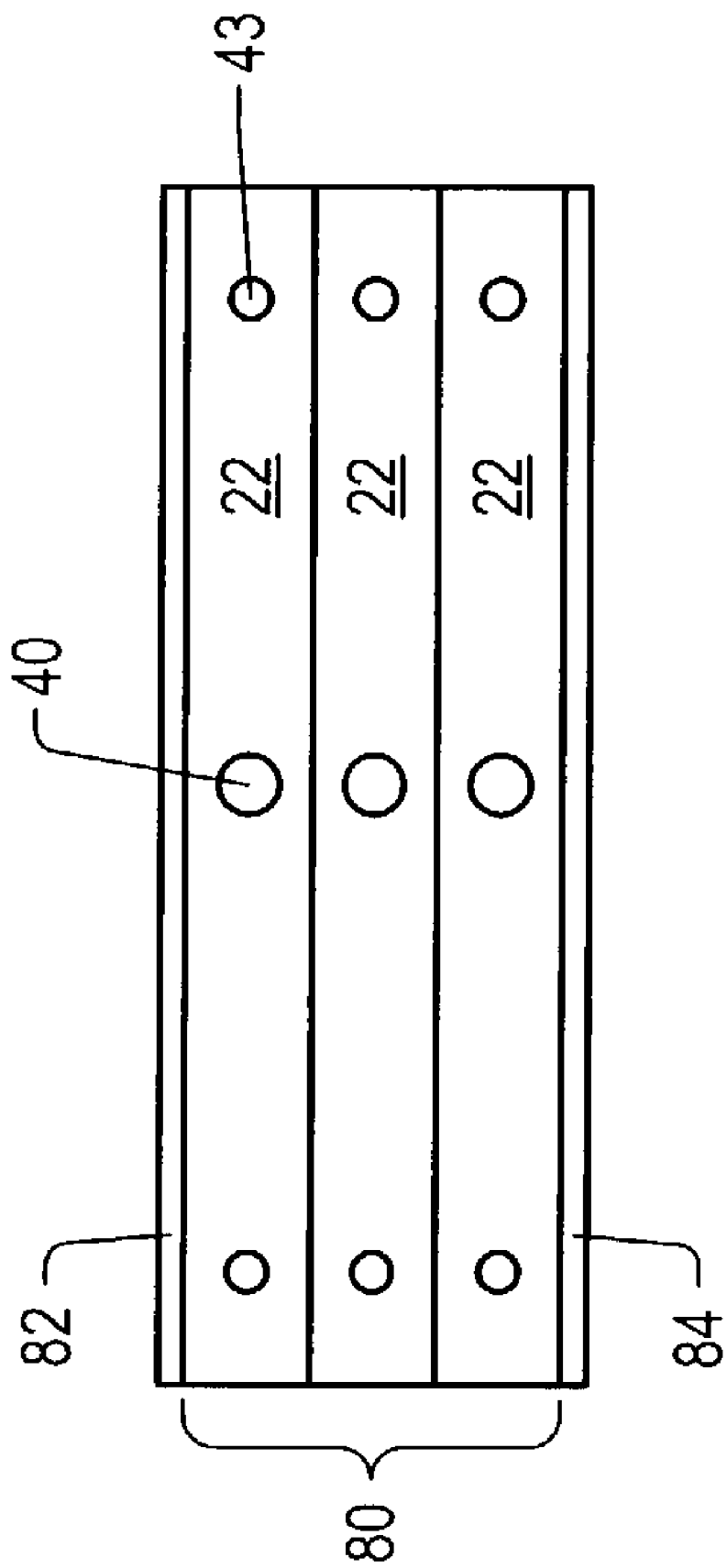
FIG. 16 shows a schematic diagram of a stack of circuit board assemblies.

In certain embodiments, a plurality of circuit board assemblies may be stacked in contiguous positions in a rack assembly. FIG. 16 shows schematic diagram of a stack 80 of circuit board assemblies 22. An upper plate 82 may be placed on top of the uppermost circuit board assembly. A lower plate 84 may be placed on the bottom of the lowermost circuit board assembly. The chassis of the circuit board assemblies may combine with the upper plate and lower plate form a single Faraday cage.

As used herein, "coupled" generally means that one element is coupled to another element either directly or indirectly. For example, in one embodiment, first and second members 41, 42 may each be coupled to lever 34 directly. In another embodiment, first members 41, second members 42, or both may be coupled to lever 34 indirectly (e.g., such as where first member 41 is coupled to lever 34 by way of second member 42, as shown in FIG. 4). As another example, mechanism 20 may be indirectly coupled to circuit board 26 by way of chassis 27 and top plate 44. As yet another example, levers 34 may be indirectly coupled to each other by slide block 76.

Although the embodiments above have been described in considerable detail, numerous variations and modifications will become apparent to those skilled in the art once the above disclosure is fully appreciated. For example, although the position of the components herein has been described in terms of "top," "bottom," "left," and "right," it will understood that a circuit board assembly may be installed in any orientation, including, but not limited to, vertically or horizontally. It is intended that the following claims be interpreted to embrace all such variations and modifications.

What is claimed is:

1. A mechanism for inserting a circuit board into a rack and extracting the circuit board from the rack, comprising:
   a pair of levers pivotally coupled to the circuit board, each lever comprising a central arm and a side arm, wherein the central arms are coupled to each other,
   a pair of first rack-engaging members; and
   a pair of second rack-engaging members;
   one of the second rack-engaging members being pivotally coupled to each of the levers,
   one of the first rack-engaging members being pivotally coupled to each of the second rack-engaging members;
   wherein the levers are operable to apply a force to the circuit board to insert the circuit board into the rack when the first rack-engaging members are in contact with engaging formations of the rack; and
   wherein the levers are operable to apply a force to the circuit board to extract the circuit board from the rack when the second rack-engaging members are in contact with engaging formations of the rack.

2. The mechanism of claim 1, wherein the first rack-engaging members are pivotally and slidably coupled to the second rack-engaging members, and wherein the first rack-engaging members are retractable by pivoting the first rack-engaging members and sliding the first rack-engaging members along slots in the second rack-engaging members.

3. The mechanism of claim 1, wherein each of the second rack-engaging members comprises a shaft pivotally coupled to the lever, the mechanism further comprising a guide for each shaft coupled to the circuit board.

4. The mechanism of claim 1, wherein the second rack-engaging members form a stop against the engaging formations when the circuit board is initially installed such that a board connector part and rack connector part are inhibited from contacting each other until the mechanism is operated to insert the circuit board into the rack.

5. The mechanism of claim 1, wherein at least one of the members is retractable.

6. The mechanism of claim 1, further comprising a third member coupled to at least one of the first rack-engaging members, wherein the third member is movable by a user to position the first rack-engaging member.

7. The mechanism of claim 1, further comprising:
   a third member pivotally coupled to one of the first rack-engaging members,
   wherein the third member comprises a knob movable by a user to position the first rack-engaging member, and an indicator on the third member to indicate when a board connector part and a rack connector part are coupled.

8. The mechanism of claim 7, further comprising a housing coupled to the circuit board, wherein alignment between a front edge of the housing and the indicator indicate that the board connector part and the rack connector part are coupled.

9. The mechanism of claim 1, further comprising an actuator coupled to the central arms of the levers.

10. The mechanism of claim 1, wherein the mechanism substantially inhibits movement of the circuit board when the circuit board is in an installed position.

11. The mechanism of claim 1, wherein the mechanism is operable to apply a total insertion force of at least about 500 pounds.

12. The mechanism of claim 1, wherein the mechanism is operable by a user to synchronously apply a plurality of insertion forces to the circuit board.

13. The mechanism of claim 1, wherein an insertion force applied to the circuit board by one of the levers during use is substantially equal to an insertion force applied to the circuit board by the other lever.

14. The mechanism of claim 1, wherein the mechanism is substantially symmetrical with respect to a longitudinal axis of the circuit board.

15. The mechanism of claim 1, further comprising a housing coupled to the circuit board.

16. A mechanism for extracting a circuit board from a rack, the mechanism comprising a pair of levers pivotally coupled to the circuit board each lever comprising a central arm and a side arm, wherein the central arms are coupled to each other, a rack-engaging shaft pivotally coupled to the side arm of each lever, wherein the levers are operable to apply a force to the circuit board to extract the circuit board from the rack when the rack-engaging shafts are in contact with engaging formations of the rack, the mechanism further comprising a guide for each rack-engaging shaft coupled to the circuit board.

17. The mechanism of claim 16, wherein the mechanism is operable to apply a total extraction force of at least about 500 pounds.

18. The mechanism of claim 16, wherein the mechanism is operable by a user to synchronously apply a plurality of extraction forces to the circuit board.

19. The mechanism of claim 16, wherein an extraction force applied to the circuit board by one of the levers is substantially equal to an extraction force applied to the circuit board by the other lever.

20. The mechanism of claim 16, wherein the mechanism is substantially symmetrical with respect to a longitudinal axis of the circuit board.

21. A mechanism for inserting a circuit board into a rack and for extracting the circuit board from the rack, comprising:
   a first rack-engaging member; and
   a second rack-engaging member;
   the first rack-engaging member being movably coupled to the second rack-engaging member, wherein the mechanism is operable to apply a force to the circuit board to insert the circuit board when the first rack-engaging member is in contact with an engaging formation of the rack, and wherein the mechanism is operable to apply a force to the circuit board to extract the circuit board when the second rack-engaging member is in contact with the engaging formation of the rack.

22. The mechanism of claim 21, further comprising a lever coupled to the second rack-engaging member.

23. The mechanism of claim 21, further comprising an actuator coupled to the second rack-engaging member.

24. The mechanism of claim 21, further comprising an actuator coupled to the second rack-engaging member, wherein the actuator comprises:
   a lead screw rotatably coupled to the circuit board; and
   a drive nut threadably coupled to the lead screw such that rotation of the lead screw advances the drive nut, wherein the drive nut is coupled to the second rack-engaging member.

25. The mechanism of claim 21, further comprising a lever coupled to the second rack-engaging member, and an actuator coupled to the lever.

26. The mechanism of claim 21, wherein the first rack-engaging member is retractable.

27. A mechanism for inserting a circuit board into a rack and for extracting the circuit board from the rack, the mechanism comprising:

a lever;
a first rack-engaging member; and
a second rack-engaging member,
the first rack-engaging member being pivotally coupled to the second rack-engaging member, the second rack-engaging member being pivotally coupled to the lever;
wherein the lever is operable to apply a force to the circuit board to insert the circuit board when the first rack-engaging member is in contact with an engaging formation on the rack, and wherein the lever is operable to apply a force to the circuit board to extract the circuit board when the second rack-engaging member is in contact with the engaging formation of the rack.

28. The mechanism of claim 27, wherein the first rack-engaging member is pivotally and slidably coupled to the second rack-engaging member, and wherein the first rack-engaging member is retractable by pivoting the first rack-engaging member and sliding the first rack-engaging member along a slot in the second rack-engaging member.

29. The mechanism of claim 27, wherein the second rack-engaging member comprises a shaft pivotally coupled to the lever, the mechanism further comprising a guide for the shaft coupled to the circuit board.

30. The mechanism of claim 27, further comprising a third member coupled with the first rack-engaging member, wherein the third member comprises a knob movable by a user to position the first rack-engaging member.

31. The mechanism of claim 27, further comprising a third member pivotally coupled to the first rack-engaging member, wherein the third member comprises a knob movable by a user to position the first rack-engaging member.

32. The mechanism of claim 31, further comprising an indicator on the third member, wherein alignment between a front edge of the housing and the indicator indicate that the board connector part and the rack connector part are coupled.

33. The mechanism of claim 31, further comprising an indicator on the third member to indicate when a board connector part and a rack connector part are not coupled, wherein non-alignment between a front edge of the housing and the indicator indicate that the board connector part and the rack connector part are not coupled.

34. The mechanism of claim 27, further comprising a resiliently deformable member coupled to the first member, wherein the resiliently deformable member is configured to urge the first rack-engaging member into engagement with the engaging formation of the rack.

35. The mechanism of claim 27, further comprising an actuator coupled to the lever.

36. A computer system, comprising:
a rack configured to receive a circuit board;
a circuit board coupled to the rack; and
a mechanism for inserting the circuit board into the rack and extracting the circuit board from the rack, the mechanism comprising:
a pair of levers pivotally coupled to the circuit board, each lever comprising a central arm and a side arm, wherein the central arms are coupled to each other,
a pair of first rack-engaging members; and
a pair of second rack-engaging members;
wherein one of the second rack-engaging members is pivotally coupled to each of the levers, and wherein one of the first rack-engaging members is pivotally coupled to each of the second rack-engaging members;
wherein the levers are operable to apply an insertion force to the circuit board to insert the circuit board into the rack when the first rack-engaging members are in contact with engaging formations of the rack, and
wherein the levers are operable to apply an extraction force to the circuit board to extract the circuit board from the rack when the second rack-engaging memebers are in contact with engaging formations of the rack.

37. The computer system of claim 36, further comprising a housing coupled to the circuit board, wherein the mechanism is disposed substantially within the housing.

38. The computer system of claim 36, further comprising a housing coupled to the circuit board, wherein the housing forms an at least partial Faraday cage around the circuit board.

39. The computer system of claim 36, wherein the computer system comprises at least two circuit boards, wherein the computer system further comprises a housing coupled to each circuit board, and wherein the housings form an at least partial Faraday cage around the circuit boards.

40. The computer system of claim 36, wherein at least one of the first rack-engaging members is retractable with respect to the second rack-engaging member to which it is coupled.

41. The mechanism of claim 16, further comprising a rack-engaging member pivotally coupled to each of the rack-engaging shafts, wherein the levers are operable to apply a force to the circuit board to insert the circuit board into the rack when the rack-engaging member is positioned to engage the engaging formation of the rack.

42. The mechanism of claim 23, further comprising a lever connecting the actuator to the second rack-engaging member.

* * * * *